US010008435B2

(12) United States Patent
Matsubara

(10) Patent No.: US 10,008,435 B2
(45) Date of Patent: Jun. 26, 2018

(54) SEMICONDUCTOR DEVICE AND METHOD OF MANUFACTURING SEMICONDUCTOR DEVICE

(71) Applicant: Renesas Electronics Corporation, Tokyo (JP)

(72) Inventor: Yoshihisa Matsubara, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/480,700

(22) Filed: Apr. 6, 2017

(65) Prior Publication Data

US 2017/0358517 A1     Dec. 14, 2017

(30) Foreign Application Priority Data

Jun. 14, 2016   (JP) .................................. 2016-118243

(51) Int. Cl.
| | |
|---|---|
| *H01L 23/00* | (2006.01) |
| *H01L 23/373* | (2006.01) |
| *H01L 21/48* | (2006.01) |
| *H01L 23/31* | (2006.01) |
| *H01L 23/367* | (2006.01) |

(52) U.S. Cl.
CPC ...... *H01L 23/3738* (2013.01); *H01L 21/4871* (2013.01); *H01L 21/4882* (2013.01); *H01L 23/3185* (2013.01); *H01L 23/3672* (2013.01); *H01L 23/373* (2013.01); *H01L 24/16* (2013.01); *H01L 2224/16157* (2013.01)

(58) Field of Classification Search
CPC .................................................. H01L 23/3738
See application file for complete search history.

(56) References Cited

U.S. PATENT DOCUMENTS

2003/0019104 A1*  1/2003  Smalc ................. H01L 21/4882
                                                              29/890.03
2015/0016064 A1*  1/2015  Yamamoto .......... H01L 23/3107
                                                              361/719

FOREIGN PATENT DOCUMENTS

JP            5641484 B2    12/2014
WO    WO 2011/007510 A1     1/2011

* cited by examiner

*Primary Examiner* — William Harriston
(74) *Attorney, Agent, or Firm* — McGinn IP Law Group, PLLC

(57) ABSTRACT

A semiconductor device including a semiconductor chip and a heat dissipation unit (heat sink) is configured as follows. The heat dissipation unit (heat sink) includes a resin tape, and a fin constituted of a graphite sheet and protruding from the resin tape. The fin, including graphene, is disposed on the semiconductor chip such that the graphene is disposed in a direction crossing a surface of the semiconductor chip. The heat dissipation unit is a rolled body in which the graphite sheet and the resin tape are layered and rolled. Thus, by use of the graphene as a constituent material of the fin, thermal conductivity is improved, whereby a heat dissipation characteristic is improved. Furthermore, since the fin is protruded from the resin tape, an exposed area of the fin is increased, and accordingly, the heat dissipation characteristic can be improved.

18 Claims, 18 Drawing Sheets

SEMICONDUCTOR DEVICE AND METHOD OF MANUFACTURING SEMICONDUCTOR DEVICE

CROSS-REFERENCE TO RELATED APPLICATION

The present application claims priority from Japanese Patent Application No. 2016-118243 filed on Jun. 14, 2016, the content of which is hereby incorporated by reference into this application.

TECHNICAL FIELD OF THE INVENTION

The present invention relates to a semiconductor device and a method of manufacturing a semiconductor device and may be suitably used, for example, in a semiconductor device having a heat dissipation unit (heat sink).

BACKGROUND OF THE INVENTION

A semiconductor device such as a CPU used in a portable terminal and the like is a semiconductor element integrated at high density. In such semiconductor device, in order to increase an operating speed, increasing an operating frequency leads to increasing an effective current in proportion to the frequency. Heat is generated by this current, and a temperature of the semiconductor device becomes high. This may cause thermal runaway due to overheat as well as thermal expansion of the semiconductor device and a package surrounding the semiconductor device. For this reason, an improvement of heat dissipation characteristics of the semiconductor device is an important issue for maintaining characteristics of the semiconductor device and prolonging life thereof.

For example, in International Publication No. WO 2011-007510 (Patent Document 1), there is disclosed a heat conductive structure provided with a graphite sheet between a heat sink and a semiconductor package.

In Japanese Patent No. 5641484 (Patent Document 2), the following method is disclosed as a method of forming a graphene thin film. (1) The graphene thin film is formed by mechanically peeling off graphite such as HOPG using Scotch Tape. (2) The graphene thin film is formed by thermal decomposition of SiC. (3) The graphene thin film is formed by performing a carbonization reaction on a transition metal film by chemical vapor deposition. Furthermore, there is disclosed a technique of growing the graphene thin film using a substrate, which is a single crystal substrate on which an epitaxial metal film is formed on an upper surface thereof, and by bringing a carbon material in contact with an upper surface of this epitaxial metal film.

SUMMARY OF THE INVENTION

As described above, temperature control of a semiconductor chip is an important issue. In particular, in a small-sized device such as a portable terminal, importance of a heat dissipation measure becomes remarkable according to a demand for downsizing and achieving higher performance. For example, in order to increase an operating speed of a central processing unit (CPU) of a portable terminal, increasing an operating frequency leads to increasing an effective current in proportion to the frequency, whereby a heat generation amount is increased.

Thus, as the heat dissipation measure of the semiconductor device, it is desired that a device configuration enabling efficient heat dissipation and a method of manufacturing the same are considered.

The typical ones of the inventions disclosed in the present application will be briefly described as follows.

A semiconductor device described in an embodiment disclosed in the present application includes a semiconductor chip, and a heat dissipation unit on the semiconductor chip. Also, the heat dissipation unit has a resin and a fin protruding from the resin, the fin has graphene, and the fin is disposed on the semiconductor chip such that the graphene is disposed in a direction crossing a surface of the semiconductor chip. For example, the heat dissipation unit is a rolled body in which a graphite sheet and a resin tape are layered and rolled.

A method of manufacturing a semiconductor device described in an embodiment disclosed in the present application includes the steps of (a) preparing a heat dissipation unit, and (b) mounting the heat dissipation unit on a semiconductor chip. Also, the heat dissipation unit has a resin and a fin protruding from the resin, and the fin has graphene. Furthermore, in the step (b), the heat dissipation unit is mounted on the semiconductor chip such that the graphene is disposed in a direction crossing a surface of the semiconductor chip.

According to a semiconductor device described in representative embodiments disclosed in the present application, it is possible to improve characteristics of the semiconductor device.

According to a method of manufacturing a semiconductor device described in the representative embodiments disclosed in the present application, it is possible to manufacture the semiconductor device having good characteristics.

BRIEF DESCRIPTIONS OF THE DRAWINGS

DESCRIPTIONS OF THE PREFERRED EMBODIMENTS

Figure 1:
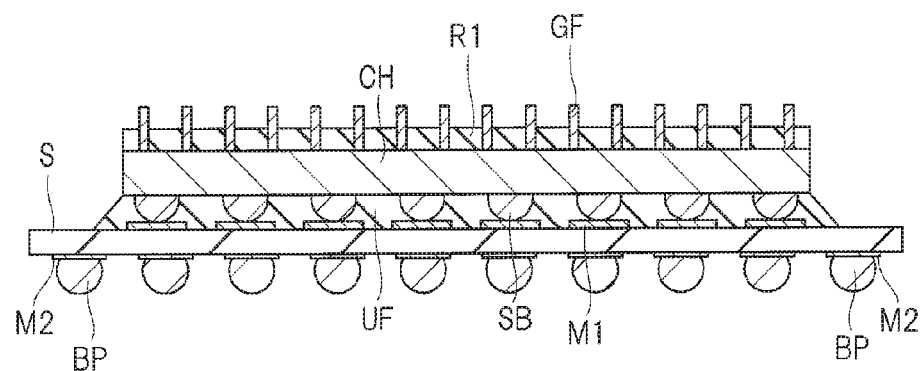
FIG. 1 is a cross-sectional view illustrating a configuration of a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable.

Furthermore, in the embodiments described below, the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the number (including number of pieces, values, amount, range, and the like) described above.

Hereinafter, embodiments of the present invention will be described in detail with reference to the accompanying drawings. Note that components having the same function are denoted by the same reference characters throughout the drawings for describing the embodiments, and the repetitive description thereof is omitted. In addition, when a plurality of similar members (portions) are present, a symbol may be added to a reference character of a collective term to indicate an individual or specific portion, in some cases. In addition, the description of the same or similar portions is not repeated in principle unless particularly required in the following embodiments.

In addition, in some drawings used in the embodiments, hatching may be omitted even in a cross-sectional view so as to make the drawings easy to see.

In addition, in cross-sectional views and perspective views, a size of each portion does not correspond to that of an actual device, and a specific portion may be shown relatively largely so as to make the drawings easy to see, in some cases. In addition, even when a cross-sectional view corresponds to a perspective view and the like, a specific portion may be shown relatively largely so as to make the drawings easy to see, in some cases.

First Embodiment

Hereinafter, a semiconductor device according to this embodiment will be described in detail with reference to the drawings.

[Descriptions of Structure]

Figure 2:
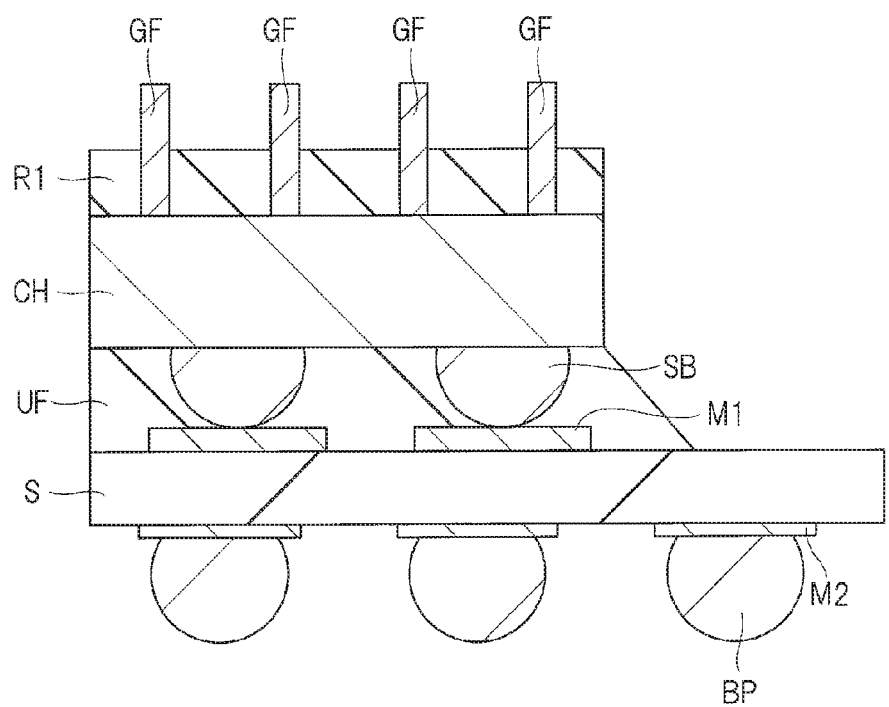
FIG. 2 is a cross-sectional view illustrating the configuration of the semiconductor device according to the first embodiment.

FIG. 1 is a cross-sectional view illustrating a configuration of a semiconductor device according to a first embodiment, and FIG. 2 is a cross-sectional view illustrating the configuration of the semiconductor device according to the first embodiment. FIG. 2 is a partially-enlarged view of FIG.

1. A semiconductor device illustrated in FIG. 1 is a flip chip mounted semiconductor device. Flip chip mounting is one of methods for mounting a semiconductor chip on a substrate, and a front surface of the semiconductor chip is electrically connected with the substrate (also referred to as a mounting substrate or a wiring substrate) not by bonding wires but by protruded terminals called bumps disposed in an array. By use of such mounting method, it is possible to manufacture a semiconductor device (semiconductor package) having substantially the same size as the semiconductor chip. Such semiconductor device (semiconductor package) having substantially the same size as the semiconductor chip may be referred to as a "chip size package."

In the semiconductor device, a semiconductor chip CH is flip chip mounted over a substrate (also referred to as a mounting substrate or a wiring substrate) S. That is, the semiconductor chip CH is connected over a conductive portion (a part of a wire or a pad region) M1 of the substrate S via a bump (in this case, a stud bump SB).

A more detailed description will be given. The stud bumps SB are provided on a lower surface of the semiconductor chip CH illustrated in FIG. 1. The plurality of stud bumps SB are disposed in an array, for example. On an upper surface of the substrate S, the conductive portions (each corresponding to a part of the wire, or the pad region) M1 are provided. Each of the stud bumps SB of the semiconductor chip CH is electrically connected to each of the conductive portion M1 of the substrate S. That is, the lower surface of the semiconductor chip CH is connected with the upper surface of the substrate S via the stud bump SB and the conductive portion M1. Also, bump electrodes BP are formed on a lower surface of the substrate S via respective conductive portions (each corresponding to a part of the wire, or the pad region) M2. The conductive portions M1 and M2 are electrically connected with each other by the corresponding wire provided inside the substrate S, for example.

Then, a gap between the lower surface of the semiconductor chip CH and the upper surface of the substrate S is filled with an underfill material UF. The underfill material UF functions as a buffer. Although a resin to be used as the underfill material UF is not limited, it is possible to use, for example, a thermosetting epoxy resin, a phenol resin, a melamine resin, and the like.

Herein, in this embodiment, a heat dissipation unit (heat sink) is provided on an upper surface of the semiconductor chip CH. A projected portion of the heat dissipation unit (heat sink) is called a fin (graphene fin) GF. The fin GF is constituted of a graphene layered body (layered film) such as a graphite sheet. Note that, in this case, a resin tape (also referred to as a resin material) R1 is provided between the fins GF.

Figure 3A:
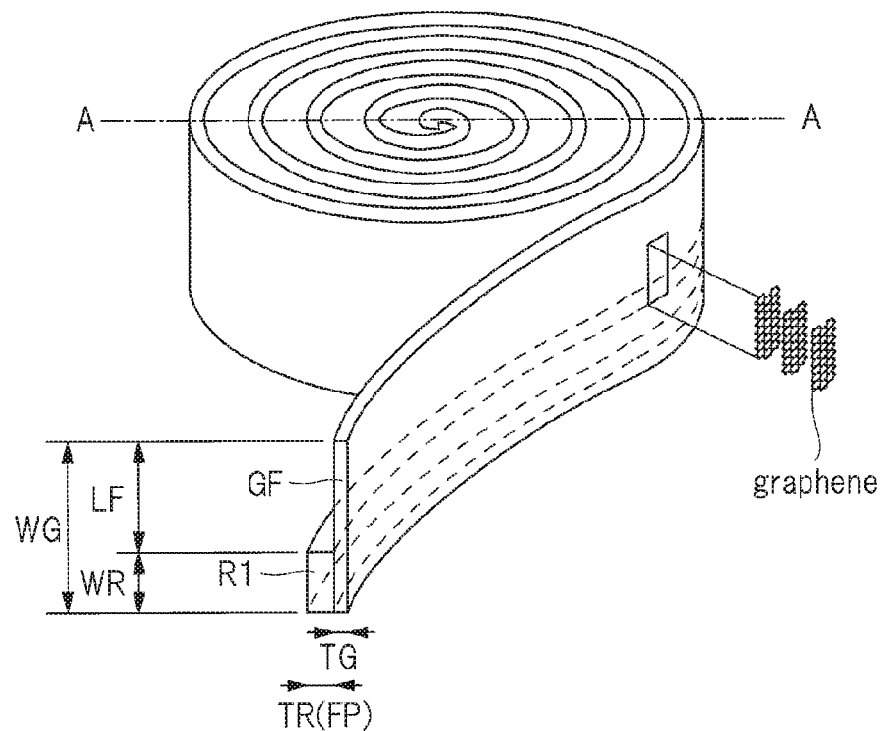
FIG. 3A is a partially exploded perspective view illustrating an exemplary configuration of a heat dissipation unit (heat sink) according to the first embodiment.
Figure 3B:
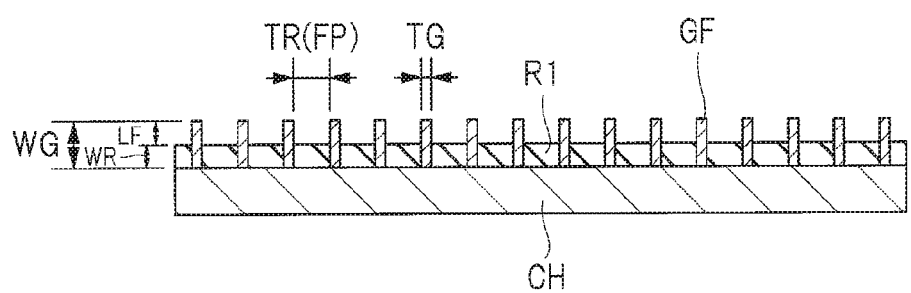
FIG. 3B is a cross-sectional view illustrating the exemplary configuration of the heat dissipation unit (heat sink) according to the first embodiment.

FIG. 3A is a partially exploded perspective view illustrating an exemplary configuration of a heat dissipation unit (heat sink) according to the first embodiment, and FIG. 3B is a cross-sectional view illustrating the exemplary configuration of the heat dissipation unit (heat sink) according to the first embodiment. For example, an upper part of FIG. 3B corresponds to a cross-section taken along a line A-A of FIG. 3A.

As illustrated in FIGS. 3A and 3B, the heat dissipation unit (heat sink) according to this embodiment has a configuration in which the graphite sheet (GF) is rolled interposing the resin tape R1. In this case, a difference between a width (WG) of the graphite sheet (GF) and a width (WR) of the resin tape R1 is a fin length LF, and a thickness (TR) of the resin tape R1 is a fin pitch (FP). Note that "TG" represents a thickness of the graphite sheet (GF). The fin length LF is substantially 100 μm, for example.

Thus, the heat dissipation unit (heat sink) includes the resin tape (also referred to as the resin material) R1 and the fin GF constituted of the graphite sheet and protruding from the resin tape. Also, the fin GF is constituted of a layered body (layered film) of graphene, and the fin GF is disposed on the semiconductor chip CH such that the graphene is disposed in a direction crossing the front surface (upper surface) of the semiconductor chip CH.

Figure 4:
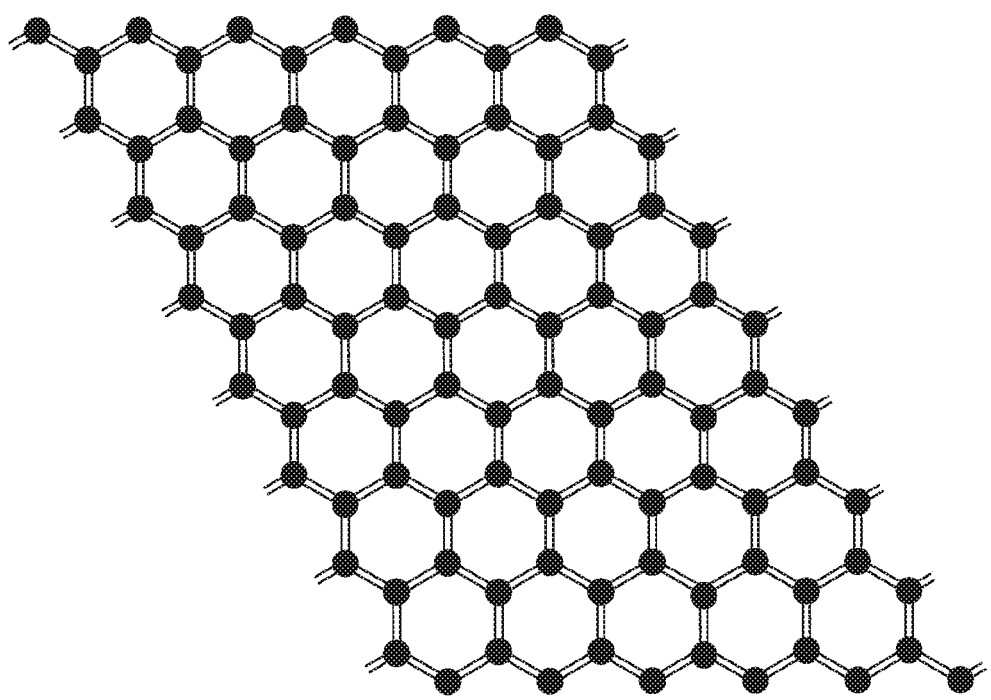
FIG. 4 is a view illustrating a structure of graphene.

FIG. 4 is a view illustrating a structure of graphene. Black dots represent carbon atoms. The graphene is a sheet of $sp^2$-bonded carbon atoms having a thickness of a single atom. It has a structure in which hexagonal lattices that are constituted of the carbon atoms and bonds therebetween expand on a plane (two dimensionally). The graphene is a basic constituent block of a graphite-based material (carbon-based material) of another dimension. For example, it is possible to obtain zero-dimensional fullerene by wrapping the graphene in a round shape, one-dimensional carbon nanotube by wrapping the graphene, and three-dimensional graphite by layering the graphene. The graphene is also manufactured and sold as a single-layer film (graphene sheet). Furthermore, the above-described graphite sheet in which the single-layer graphene is layered is also manufactured and sold.

Thus, in this embodiment, by use of the graphene as a constituent material for the fin GF of the heat dissipation unit (heat sink), it is possible to improve thermal conductivity and to improve a heat dissipation characteristic. Furthermore, since the fin GF is protruded from the resin tape R1 which fixes the fin GF, an exposed area of the fin GF is improved, whereby it is possible to further improve the heat dissipation characteristic.

A material of the resin tape R1 is not limited, and it is possible to use, for example, flexible acrylic rubber and polyether ether ketone resin (PEEK). In particular, a vertically-oriented graphite tape in which graphite particles are vertically oriented within the flexible acrylic rubber has a high thermal conductivity of substantially 90 W/(m·K), whereby it is suitable as the resin tape R1. Also, a tape of the polyether ether ketone resin in which a high thermal conducting acrylic adhesive is used has a thermal conductivity of 0.8 W/(m·K) and is highly flexible, whereby it is suitable as the resin tape R1.

Figure 5:
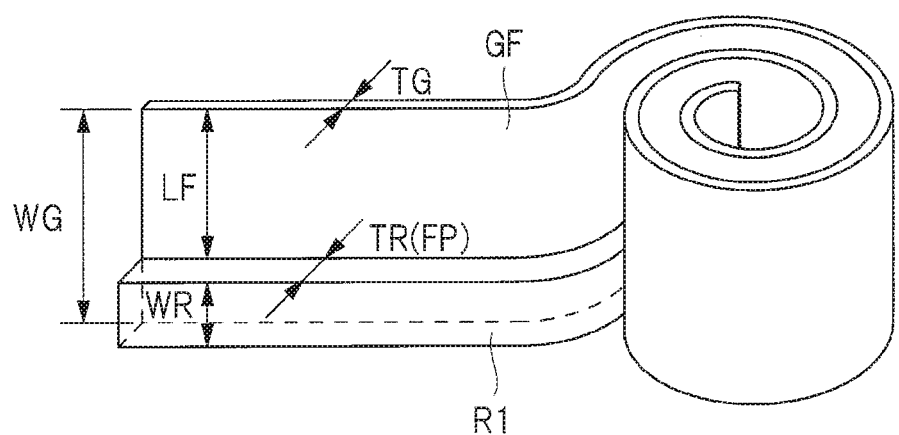
FIG. 5 is a perspective view illustrating a step of forming the heat dissipation unit (heat sink)
Figure 6A:
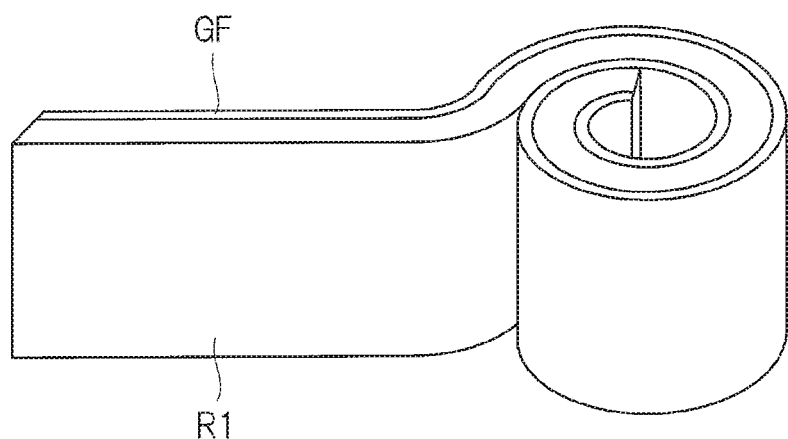
FIG. 6A is a perspective view illustrating another step of forming the heat dissipation unit (heat sink)
Figure 6B:
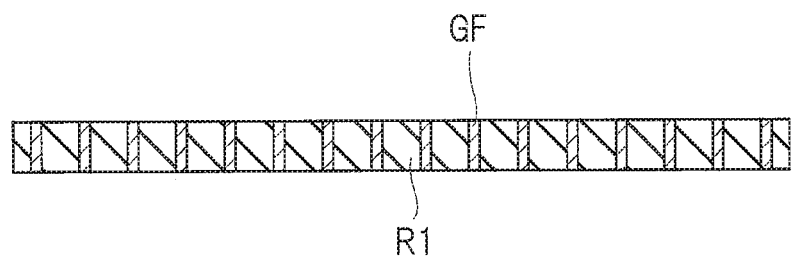
FIG. 6B is a cross-sectional view illustrating the step of forming the heat dissipation unit (heat sink) of FIG. 6A.
Figure 7A:
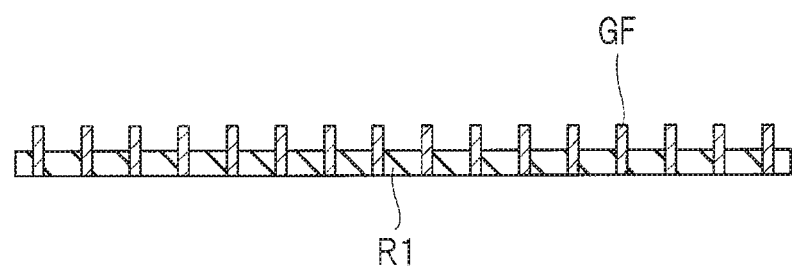
FIG. 7A is a cross-sectional view illustrating the step of forming the heat dissipation unit (heat sink), continued from FIGS. 6A and 6B.
Figure 7B:
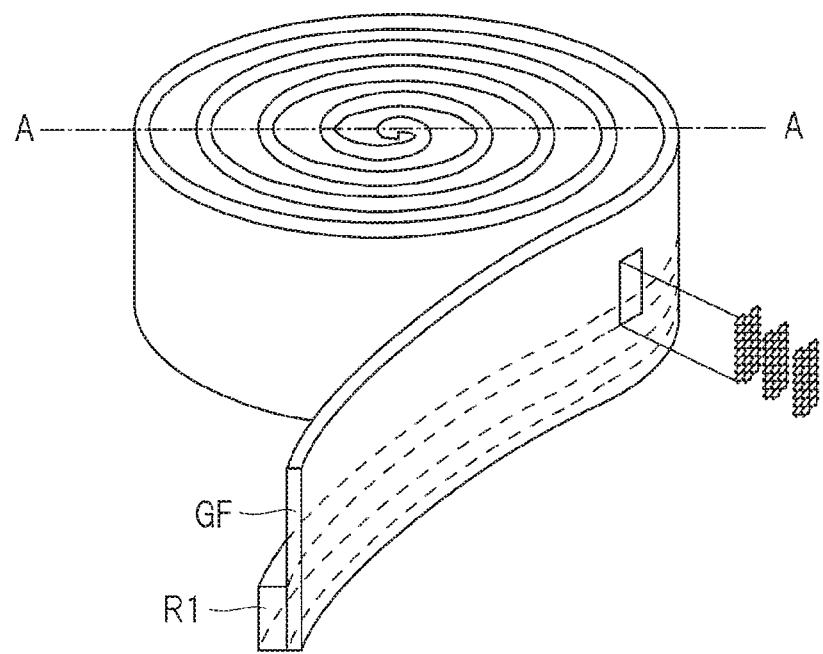
FIG. 7B is a partially exploded perspective view illustrating the step of forming the heat dissipation unit (heat sink) of FIG. 7A.

Although a step of forming the heat dissipation unit (heat sink) of FIGS. 3A and 3B is not limited, it may be formed as follows, for example. FIG. 5 is a perspective view illustrating a step of forming the heat dissipation unit (heat sink). FIG. 6A is a perspective view illustrating another step of forming the heat dissipation unit (heat sink), and FIG. 6B is a cross-sectional view illustrating the step of forming the heat dissipation unit (heat sink) of FIG. 6A. FIG. 7A is a cross-sectional view illustrating the step of forming the heat dissipation unit (heat sink), continued from FIGS. 6A and 6B, and FIG. 7B is a partially exploded perspective view illustrating the step of forming the heat dissipation unit (heat sink) of FIG. 7A. First, a first forming example will be described. For example, as illustrated in FIG. 5, after the graphite sheet (GF) and the resin tape R1 are overlapped and rolled together, by performing heat treatment thereon, it is possible to form the heat dissipation unit (heat sink). In this case, the resin tape R1 having a width (short side) smaller than a width (short side) of the graphite sheet (GF) is used, and long sides of the graphite sheet (GF) and the resin tape R1 are aligned and rolled.

Next, a second forming example will be described. As illustrated in FIGS. 6A and 6B, it is also possible to form the heat dissipation unit (heat sink) by overlapping the graphite sheet (GF) and the resin tape R1 having substantially the same width (short side) as the width (short side) of the graphite sheet (GF) and rolling them together (FIG. 6A). In this case, as illustrated in FIG. 6B, since a side surface of the fin GF is not exposed, subsequently, as illustrated in FIG. 7A, the resin tape R1 on one side (an upper side of FIG. 7A) of the rolled sheet (rolled body) obtained by overlapping the graphite sheet and the resin tape R1 and rolling them together is etched (etched back). Accordingly, in the heat dissipation unit (heat sink), the fin GF protrudes from the resin tape R1 by the same amount as the amount by which the resin tape R1 is etched (FIG. 7B). It is possible to selectively etch the resin tape R1 by use of a mixed gas of oxygen and $CF_4$, for example. Subsequently, it is possible to form the heat dissipation unit (heat sink) by performing the heat treatment thereon.

Note that, here, there is described an etching step of the above-described rolled body, that is, the above-described etching is performed in the step of forming the heat dissipation unit (heat sink) before the heat dissipation unit (heat sink) is mounted on the semiconductor chip CH; however, this etching step may also be performed after the rolled body illustrated in FIGS. 6A and 6B is mounted on the semiconductor chip CH (see a first application example described below).

In general, a heat dissipation amount due to heat transfer from a surface area of an object is expressed by the following formula:

$$Q = \eta \cdot hm \cdot S \cdot \Delta T$$

where Q is the heat dissipation amount [W], η is fin efficiency, hm is an average heat transfer coefficient [W/($m^2 \cdot K$)], S is a fin area [$m^2$], and ΔT is a temperature difference [K] between an object surface and air.

That is, when the fin area is increased, the heat dissipation amount increases. Thus, in order to increase the heat dissipation amount, it is necessary to increase the fin length.

Figure 8:
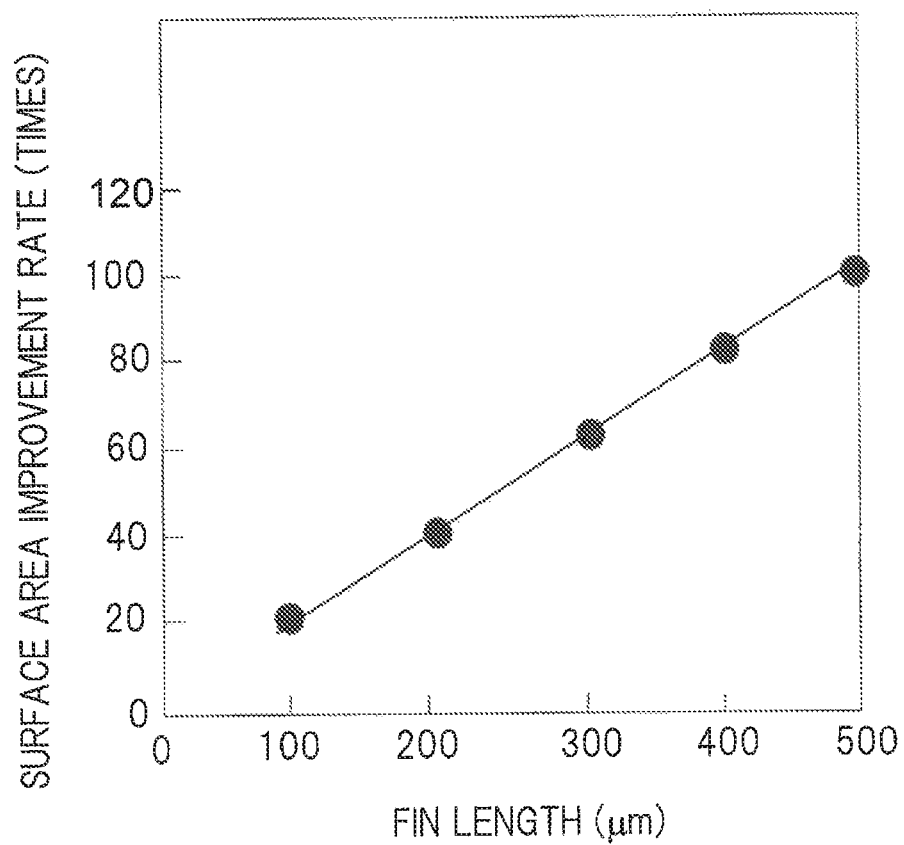
FIG. 8 is a graph illustrating an effect of increasing a fin area (a surface area of an exposed fin)

FIG. 8 is a graph illustrating an effect of increasing the fin area, that is, the surface area of the exposed fin. A horizontal axis indicates the fin length (μm), and a vertical axis indicates an improvement rate of the surface area (times). Calculation is performed by use of a graphite sheet thickness of 10 μm, a fin pitch of 100 μm, and a fin length (exposed length) of 100 μm.

For example, for fifty fins, when the fin length is increased from 5 μm to 100 μm, the exposed surface area of the fin increases by 20 times. Furthermore, when the fin length is increased from 5 μm to 500 μm, the exposed surface area of the fin increases by 100 times. Thus, an effect of increasing the heat dissipation amount by increasing an exposure amount of the fin is large.

In considering the heat dissipation amount, however, it is necessary to consider heat capacity. That is, as a fin density is increased, heat between the fins is hardly released. For this reason, the heat dissipation characteristic does not improve linearly corresponding to an increased amount of the exposed surface area of the fin.

Figure 9:
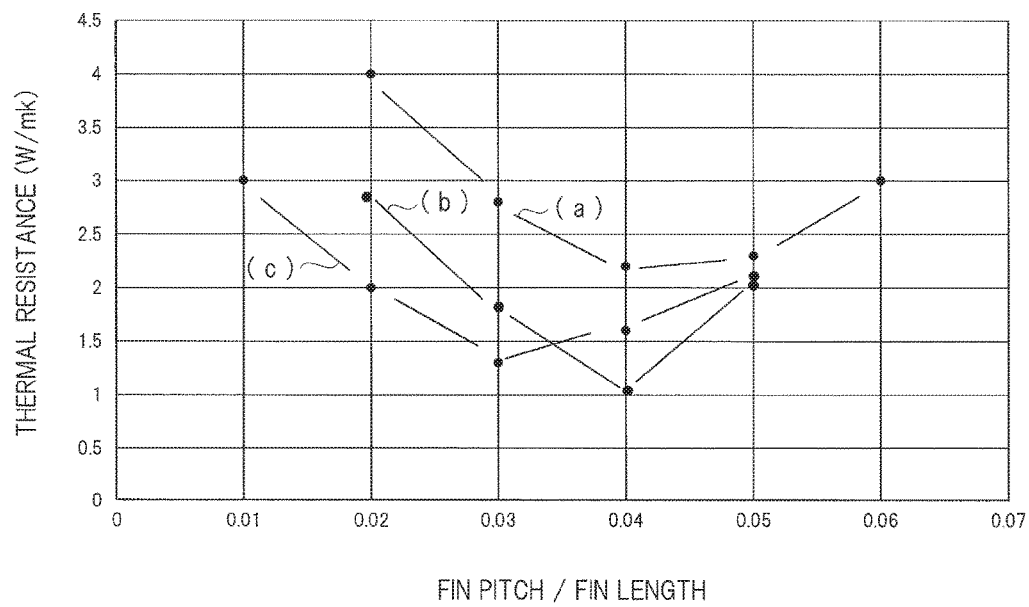
FIG. 9 is a graph illustrating dependency of thermal resistance on fin pitch/fin length.

FIG. 9 is a graph illustrating dependency of thermal resistance on the fin pitch/fin length. A graph (a) represents a case in which there is no forced-air cooling, a graph (b) represents a case in which there is forced-air cooling of 1 m/s, and a graph (c) represents a case in which there is forced-air cooling of 0.5 m/s. Here, calculation is performed by setting the fin pitch to a fixed value and changing the fin length.

For the graph (a) with no forced-air cooling, the thermal resistance decreases to substantially 2.25 W/mk when the fin pitch/fin length is between 0.06 and 0.04; however, the thermal resistance increases when the fin pitch/fin length is 0.03 or smaller.

For the graph (b) with 1 m/s forced-air cooling, the thermal resistance decreases to substantially 1 W/mk when the fin pitch/fin length is between 0.06 and 0.04; however, the thermal resistance increases when the fin pitch/fin length is 0.03 or smaller.

For the graph (c) with 0.5 m/s forced-air cooling, the thermal resistance decreases to substantially 1.25 W/mk when the fin pitch/fin length is between 0.06 and 0.03; however, the thermal resistance increases when the fin pitch/fin length is 0.02 or smaller. Thus, when a wind velocity is large, wind hardly enters between the fins, and an effect thereof may be reduced.

Thus, there is a suitable range for the fin pitch/fin length, and by using the forced-air cooling in combination, it is possible to enhance the effect of increasing the exposed area of the fin. Furthermore, in a case where the forced-air cooling is used in combination, there is a suitable range for the wind velocity.

Thus, in a case where it is difficult to incorporate a heat dissipation unit of a forced-air cooling type (so-called fan or the like) in a small-sized device such as a portable terminal, it is possible to enhance the effect of increasing the exposed area of the fin by setting the suitable range for the fin pitch/fin length. Furthermore, for a terminal in which it is possible to incorporate the heat dissipation unit of the forced-air cooling type (so-called fan or the like), it is possible to enhance the effect of increasing the exposed area of the fin by using the forced-air cooling in combination and by optimizing the wind velocity.

Furthermore, in this embodiment, as described in the first forming example (FIG. 5), it is possible to easily adjust the fin pitch and the fin length by adjusting the width and the thickness of the graphite sheet (GF) and the width and the thickness of the resin tape R1.

Furthermore, also in the case illustrated in the second forming example (FIGS. 6A and 6B), it is possible to easily adjust the fin pitch and the fin length by adjusting the width and the thickness of the graphite sheet (GF) and the etching amount and the thickness of the resin tape R1.

Furthermore, in a case where the semiconductor device according to this embodiment and the heat dissipater of the forced-air cooling type (so-called fan or the like) are used in combination, for example, in a case where these are incorporated in the same housing as a system, since the fin is spirally disposed, it is easy to adjust a wind direction of the forced-air cooling, whereby it is possible to improve the heat dissipation characteristic. For example, by sending air toward a center of the spiral fin GF where heat tends to accumulate, it is possible to blow wind (air) along a spiral and at the same time, to release the heat together with the wind from an open end of the spiral.

[Description of Manufacturing Method]

Figure 10:
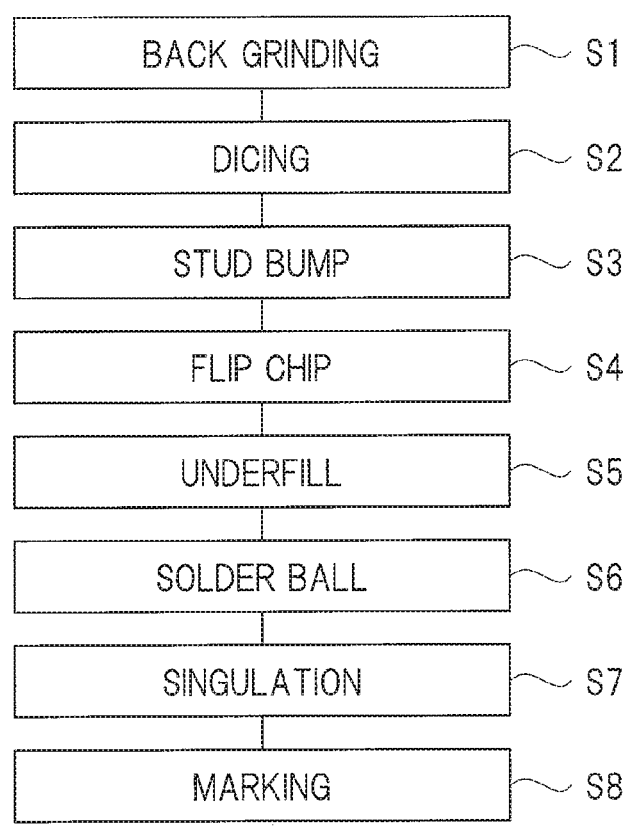
FIG. 10 is a flowchart illustrating a flow of a manufacturing process of the semiconductor device according to the first embodiment.

Next, a manufacturing process of the semiconductor device according to this embodiment will be described, and a structure of the semiconductor device according to this embodiment will be further clarified. FIG. 10 is a flowchart illustrating a flow of the manufacturing process of the semiconductor device according to the present embodiment. FIGS. 11 to 15 are cross-sectional views illustrating the manufacturing process of the semiconductor device according to the present embodiment.

As illustrated in FIG. 10, a flow of the manufacturing process of the semiconductor device according to this embodiment includes a back grinding step S1, a dicing step S2, a stud bump forming step S3, a flip chip mounting step S4, an underfill filling step S5, a solder ball forming step S6, a singulation step S7, and a marking step S8.

Figure 11:
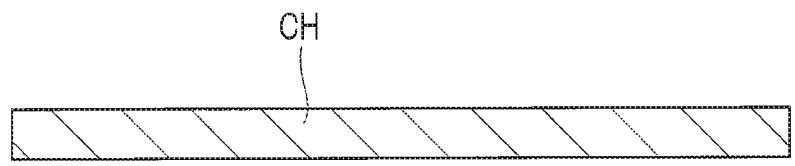
FIG. 11 is a cross-sectional view illustrating the manufacturing process of the semiconductor device according to the first embodiment.

A semiconductor chip illustrated in FIG. 11 is cut from a wafer. The wafer is a substantially circular plate-shape member constituted of a semiconductor such as Si. On a main surface of the wafer, semiconductor elements such as a MISFET are formed. These elements are connected via a plurality of wiring layers. A protective film is formed on uppermost wiring layer, and a part of rewiring that is exposed from an opening portion of the protective film serves as the pad region. The pad regions are disposed in an array, for example. Note that, here, an example of forming the MISFET as the exemplary semiconductor element has been described; however, it is also possible to form a storage element such as a DRAM and a flash memory as the semiconductor element.

After the step of forming the above-described semiconductor element and the wire (also referred to as a front-end process), the lower surface (back surface) of the wafer is ground (back grinding step S1), and the wafer is cut into each chip region (dicing step S2). These steps are the same as those in the first embodiment. Accordingly, the semiconductor chip CH is diced (FIG. 11).

Figure 12:
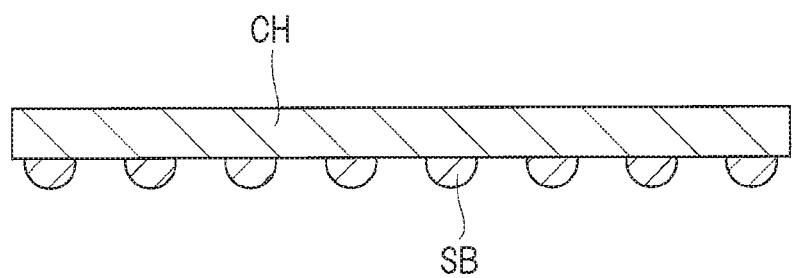
FIG. 12 is a cross-sectional view illustrating the manufacturing process of the semiconductor device according to the first embodiment, continued from FIG. 11.

Next, as illustrated in FIG. 12, the stud bump SB is formed on the lower surface of the semiconductor chip CH (stud bump forming step S3). As a material of the stud bump, for example, metal such as gold may be used. For example, a molten ball is formed by melting a gold wire in a capillary by an electrical discharge, and the molten ball is pressed against and bonded to the pad region (not illustrated) on the semiconductor chip CH. Next, the wire is cut, and leveling is performed as necessary to make a bump height uniform. Purity of gold of the gold wire may be lower than purity thereof of a gold wire used in a wire bonding step. Furthermore, in a stud bump configuration, an amount of wire to be used is smaller than an amount thereof in the wire bonding step since there is no loop. Still furthermore, it is not necessary to design the capillary to be used in the stud bump forming step considering a loop or a second bonding step. Still furthermore, in the stud bump configuration, since a face angle is zero degree and there is no loop, it is not necessary to take contact between the wires into account, whereby it is not necessary to use a bottleneck capillary having a thin tip.

Figure 13:
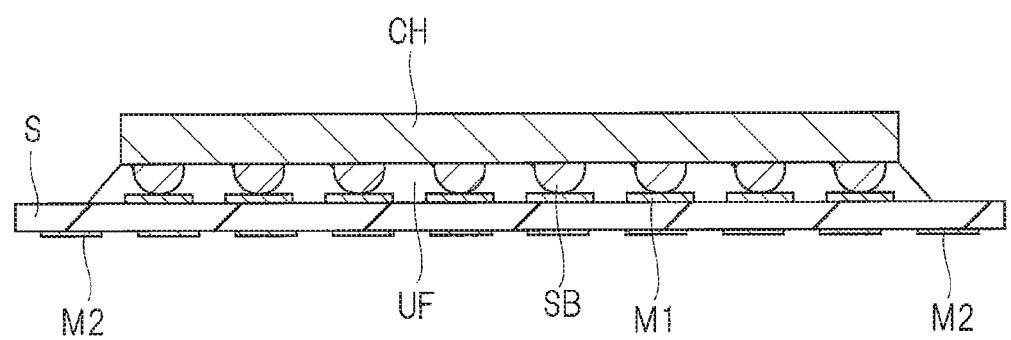
FIG. 13 is a cross-sectional view illustrating the manufacturing process of the semiconductor device according to the first embodiment, continued from FIG. 12.

Next, as illustrated in FIG. 13, by setting a side on which the stud bump SB is formed on the semiconductor chip CH as a lower side, the stud bump SB is aligned with the conductive portion M1 of the substrate S, and the stud bump SB is connected to the conductive portion M1 (flip chip mounting step S4). Subsequently, a gap between the semiconductor chip CH and the substrate S is filled with a liquid underfill material (underfill filling step S5). For example, the liquid underfill material is supplied from an outer peripheral portion of the semiconductor chip CH and is flowed into the gap between the lower surface of the semiconductor chip CH and the substrate S. Subsequently, by performing heating treatment thereon, the liquid underfill material is cured. As a resin constituting the underfill material UF, for example, a thermosetting resin may be used.

Figure 14:
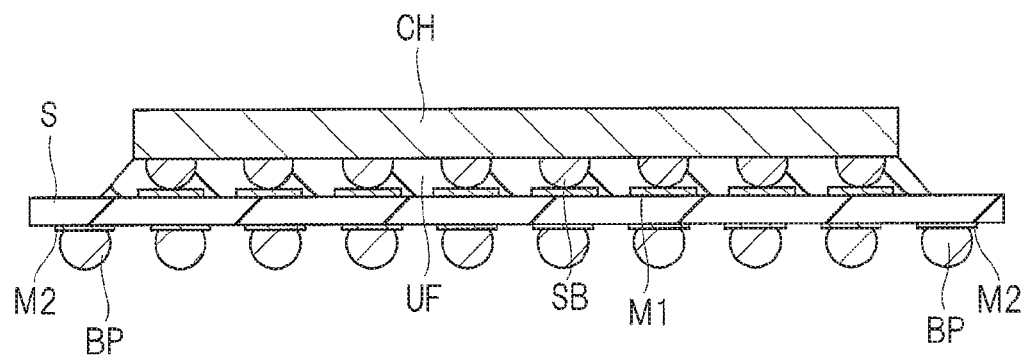
FIG. 14 is a cross-sectional view illustrating the manufacturing process of the semiconductor device according to the first embodiment, continued from FIG. 13.

Next, as illustrated in FIG. 14, a solder ball is formed on the conductive portion M2 of the substrate S (solder ball forming step S6). For example, the solder ball is adhered to the conductive portion M2 of the substrate S via solder paste or the like.

Next, in a case where a plurality of semiconductor devices are connected with one another, for example, the semiconductor devices are cut apart and are molded (singulation step S7). Next, a model number or the like of a product is imprinted on the upper surface of each of the semiconductor devices (for example, the upper surface of the semiconductor chip CH) (marking step S8).

Figure 15:
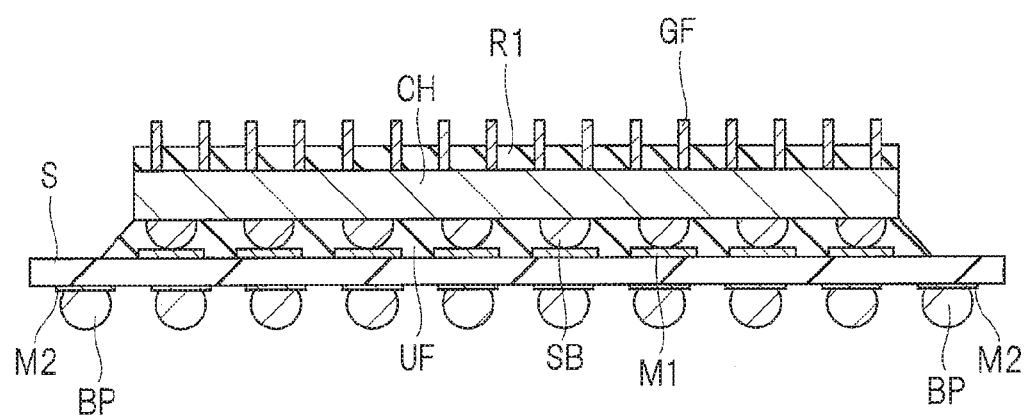
FIG. 15 is a cross-sectional view illustrating the manufacturing process of the semiconductor device according to the first embodiment, continued from FIG. 14.

Subsequently, the heat dissipation unit (heat sink) described with reference to FIGS. 5 to 7B is stuck to the upper surface of the semiconductor chip CH as illustrated in FIG. 15 (heat dissipation unit mounting step). For example, the resin tape R1 of the heat dissipation unit (heat sink) is bonded to the upper surface of the semiconductor chip CH by thermocompression bonding.

Thus, according to this embodiment, the heat dissipation unit (heat sink) constituted of the graphene is provided on the semiconductor chip CH, whereby it is possible to improve the heat dissipation characteristic of the semiconductor chip CH. The graphene has good thermal conductivity and has a light weight, whereby it is suitably used as the heat dissipation unit (heat sink) for dissipating heat. Then, the graphene is disposed in a vertical direction to the upper surface of the semiconductor chip CH from the upper surface of the semiconductor chip CH to the outside, whereby a heat dissipation effect is particularly improved.

Note that, in the above-described steps, the heat dissipation unit mounting step is performed after the marking step S8; however, the heat dissipation unit mounting step may also be performed after the dicing step S2 but before the marking step S8. Furthermore, the heat dissipation unit mounting step may also be performed after the step of forming the semiconductor element and the wire (also referred to as the front-end process) but before the dicing step S2, that is, in a state of the wafer.

First Application Example

In this application example, there will be described a case where, after the graphite sheet (GF) and the resin tape R1 that are overlapped and rolled together (rolled body) are mounted on the semiconductor chip CH, a part of the resin tape R1 is etched.

Figure 16:
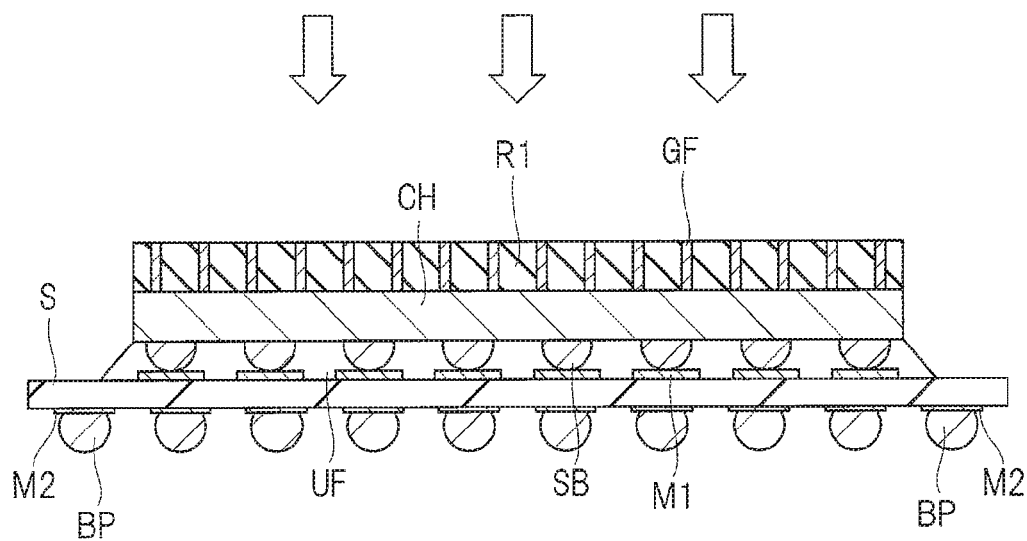
FIG. 16 is a cross-sectional view illustrating a manufacturing process of a semiconductor device according to a first application example of the first embodiment.
Figure 17:
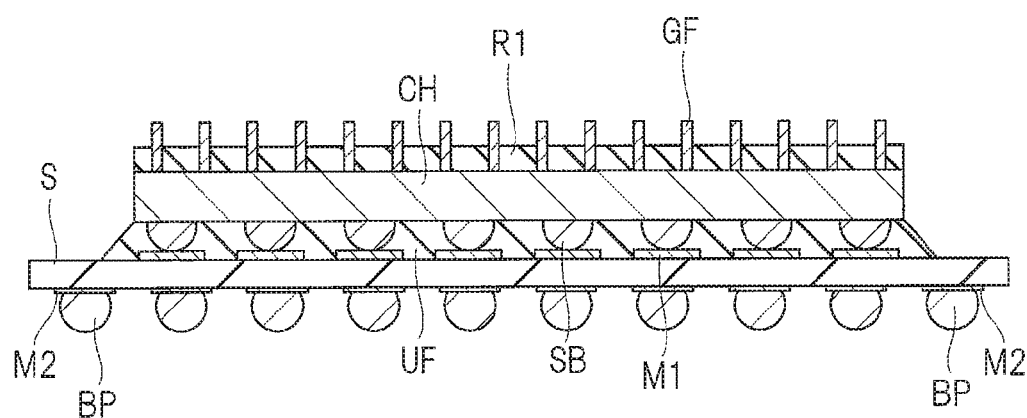
FIG. 17 is a cross-sectional view illustrating the manufacturing process of the semiconductor device according to the first application example of the first embodiment, continued from FIG. 16.

FIGS. 16 and 17 are cross-sectional views illustrating a manufacturing process of a semiconductor device according to the first application example of the present embodiment.

For example, the rolled body (the graphite sheet (GF) and the resin tape R1 that have substantially the same width and are overlapped and rolled together) in a state illustrated in FIGS. 6A and 6B is mounted on and bonded, by thermocompression bonding, to the upper surface of the semiconductor chip illustrated in FIG. 14 described above (FIG. 16).

Next, the resin tape R1 on one side of the above-described rolled body (a surface opposite to a compressed surface in an upper side of FIG. 16) is etched. Accordingly, the heat dissipation unit (heat sink) protrudes from the resin tape R1 by the same amount as the amount by which the resin tape R1 is etched (for example, substantially 100 μm) (FIG. 17). For example, by use of a mixed gas of oxygen and $CF_4$, it is possible to selectively etch (etch back) the resin tape R1.

Second Application Example

Figure 18:
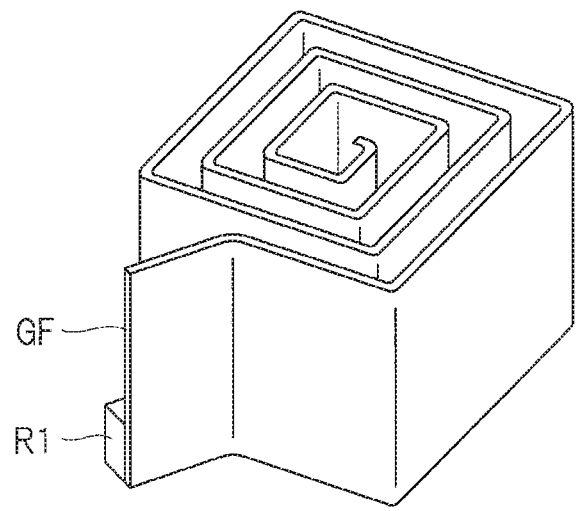
FIG. 18 is a perspective view illustrating a configuration of a heat dissipation unit (heat sink) of a semiconductor device according to a second application example of the first embodiment.

In the heat dissipation unit (heat sink) described with reference to FIGS. 5 to 7B, the graphite sheet (GF) and the resin tape R1 are overlapped and rolled together into a substantially circular shape; however, they may also be rolled in a substantially rectangular shape as illustrated in FIG. 18. FIG. 18 is a perspective view illustrating a configuration of a heat dissipation unit (heat sink) of a semiconductor device according to the second application example of the present embodiment.

Figure 19A:
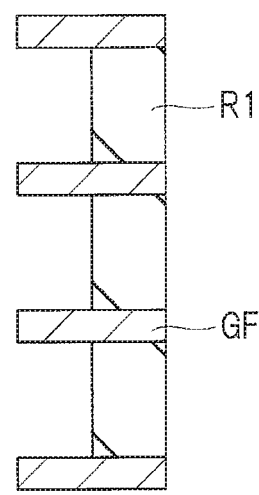
FIG. 19A is a cross-sectional view illustrating another configuration of the heat dissipation unit (heat sink) of the semiconductor device according to the second application example of the first embodiment.
Figure 19B:
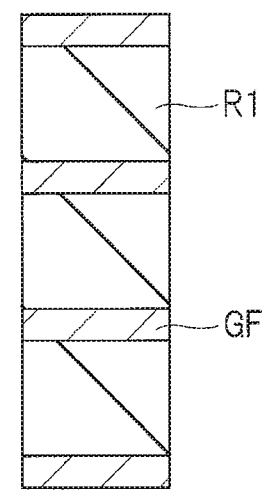
FIG. 19B is a cross-sectional view illustrating still another configuration of the heat dissipation unit (heat sink) of the semiconductor device according to the second application example of the first embodiment.

As illustrated in FIG. 19A, it is also possible to use a layered body in which the substantially rectangular graphite sheet (GF) and the substantially rectangular resin tape R1 are alternately layered, as the heat dissipation unit (heat sink). FIG. 19A is a cross-sectional view illustrating another configuration of the heat dissipation unit (heat sink) of the semiconductor device according to the second application example of the present embodiment, and FIG. 19B is a cross-sectional view illustrating still another configuration of the heat dissipation unit (heat sink) of the semiconductor device according to the second application example of the present embodiment. For example, the rectangular graphite sheet (GF) and the rectangular resin tape R1 are alternately overlapped. A short side of the graphite sheet (GF) and a short side of the resin tape R1, for example, are substantially the same as those of the heat dissipation unit (heat sink) illustrated in FIG. 5, and a long side of the graphite sheet (GF) and a long side of the resin tape R1 are each shorter than a long side of the rectangular semiconductor chip and are substantially several millimeters, for example. It is also possible to form the heat dissipation unit (heat sink) by aligning one of the long sides of such graphite sheet (GF) with that of the resin tape R1, alternately layering them, and performing the heating treatment thereon.

It is also possible to form the heat dissipation unit (heat sink) by etching a layered body in which the graphite sheet (GF) and the resin tape R1 that have substantially the same width are alternately layered, as illustrated in FIG. 19B. For example, the graphite sheet (GF) and the resin tape R1, which are rectangular and have substantially the same short sides, are alternately overlapped to form the layered body, and the heating treatment is performed thereon (FIG. 19B). Next, the resin tape R1 on one side of the laminated body is etched. Accordingly, the graphite sheet (GF) protrudes from the resin tape R1 by the same amount as the amount by which the resin tape R1 is etched. For example, the resin tape R1 is selectively etched (etched back) by use of a mixed gas of oxygen and $CF_4$. In this manner, the heat dissipation unit (heat sink) may also be formed. Thus, the above-described etching may be performed in the step of forming the heat dissipation unit (heat sink), and the above-described etching may also be performed after an exposed portion of the resin tape R1 of the above-described laminated body is mounted on the semiconductor chip CH.

Third Application Example

As has been described with reference to FIG. 15, in the manufacturing process of the above-described semiconductor device, the heat dissipation unit (heat sink) is stuck by thermocompression bonding and the like to the upper surface of the semiconductor chip CH; however, the heat dissipation unit (heat sink) may also be stuck by use of a bonding member. As the bonding member, an adhesive tape having good thermal conductivity such as a silicon tape and a copper tape, resin, and the like may be used.

In this case, in order to enhance the contact between the semiconductor chip CH and the graphene heat dissipation unit (heat sink), for example, in the heat dissipation unit (heat sink), the resin tape R1 on a contact surface side of the semiconductor chip CH may also be slightly etched (slight etching).

Figure 20:
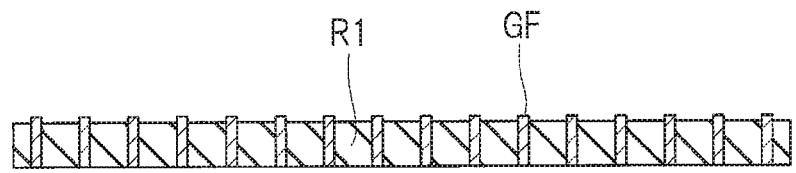
FIG. 20 is a cross-sectional view illustrating a manufacturing process of a semiconductor device according to a third application example of the first embodiment.
Figure 21:
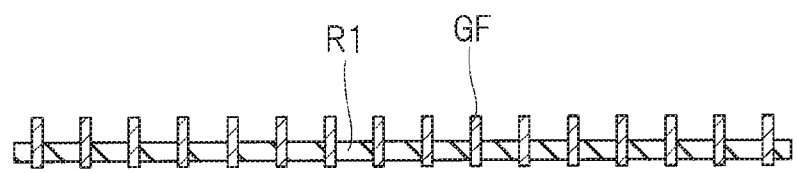
FIG. 21 is a cross-sectional view illustrating the manufacturing process of the semiconductor device according to the third application example of the first embodiment.
Figure 22:
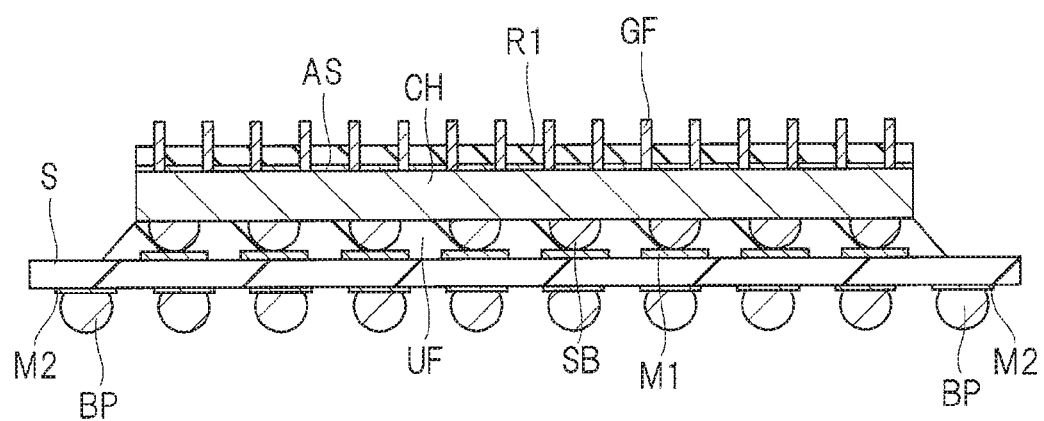
FIG. 22 is a cross-sectional view illustrating the manufacturing process of the semiconductor device according to the third application example of the first embodiment.

FIGS. 20 to 22 are cross-sectional views illustrating a manufacturing process of a semiconductor device according to the present application example. For example, there is prepared the rolled body in which the graphite sheet (GF) and the resin tape R1 that have substantially the same width and are overlapped and rolled together as illustrated in FIGS. 6A and 6B, and the resin tape R1 on a first surface side (contact surface side with the semiconductor chip CH, an upper surface side of FIG. 20) is slightly etched (FIG. 20). An etching amount corresponds to a thickness of the bonding member, for example, and is smaller than a length of the heat dissipation unit (heat sink).

Next, the resin tape R1 on a second surface side of the above-described rolled body (the upper surface side of FIG. 21) is etched. Accordingly, the heat dissipation unit (heat sink) protrudes from the resin tape R1 by the same amount as the amount by which the resin tape R1 is etched. Next, heating treatment is performed thereon, and the heat dissipation unit (heat sink) is completed (FIG. 21).

Next, the heat dissipation unit (heat sink) is stuck to the upper surface of the semiconductor chip CH as illustrated in FIG. 22 (heat dissipation unit (heat sink) mounting step). For example, a silicon tape is stuck to the upper surface of the semiconductor chip CH, and the first surface side (slight etched side) of the heat dissipation unit (heat sink) is bonded thereto. A molten resin is dropped on the upper surface of the semiconductor chip CH, the first surface side of the heat dissipation unit (heat sink) is pressed against the molten resin, and the molten resin is cured, whereby the heat dissipation unit (heat sink) is fixed.

Thus, by slightly etching the first surface side of the heat dissipation unit (heat sink), even when the bonding member is used, the contact between the semiconductor chip CH and the fin GF is enhanced, whereby it is possible to improve the heat dissipation characteristic.

Second Embodiment

In this embodiment, a case in which a surface of a semiconductor chip is sealed with a resin will be described. Hereinafter, a semiconductor device according to this embodiment will be described in detail with reference to the drawings.

[Structure Description]

Figure 23:
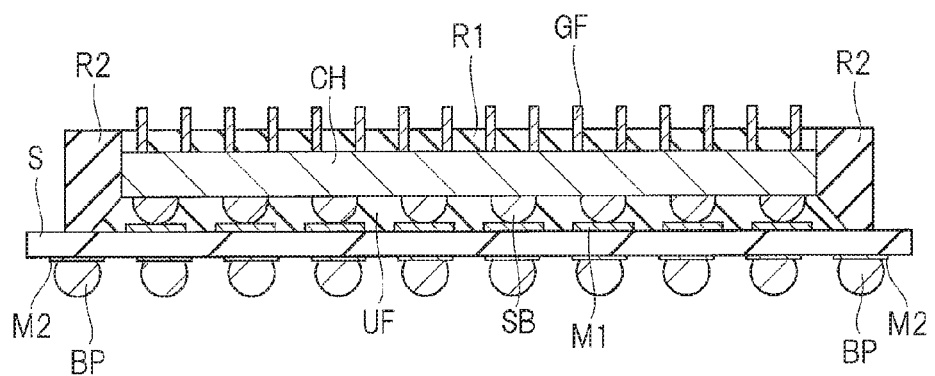
FIG. 23 is a cross-sectional view illustrating a configuration of a semiconductor device according to a second embodiment.

FIG. 23 is a cross-sectional view illustrating a configuration of the semiconductor device according to the present embodiment. The semiconductor device illustrated in FIG. 23 includes a semiconductor chip CH, and a heat dissipation unit (heat sink) and a sealing resin (also referred to as a molding resin) R2, which cover the semiconductor chip CH. In the same manner as in the first embodiment, the semiconductor chip CH is bonded to a substrate (also referred to as a mounting substrate or a wiring substrate) S via a stud bump SB and an underfill material UF.

Then, the heat dissipation unit (heat sink) is stuck to an upper surface of the semiconductor chip CH, and a side surface of the semiconductor chip CH is covered with the sealing resin R2. Note that, although not illustrated in a cross-section of FIG. 23, the upper surface of the semiconductor chip CH where the heat dissipation unit (heat sink) is not extended is also covered with the sealing resin R2. Thus, the heat dissipation unit (heat sink) is embedded in the sealing resin R2.

For example, a height (width) of a resin tape R1 on the semiconductor chip CH and a height (width, or thickness) of the sealing resin R2 are substantially the same. Then, an upper part of a graphite sheet (GF) protrudes from the resin tape R1.

Thus, since the heat dissipation unit (heat sink) constituted of graphene is provided on the semiconductor chip CH in this embodiment as well, it is possible to improve the heat dissipation characteristic of the semiconductor chip CH.

[Description of Manufacturing Method]

Figure 24:
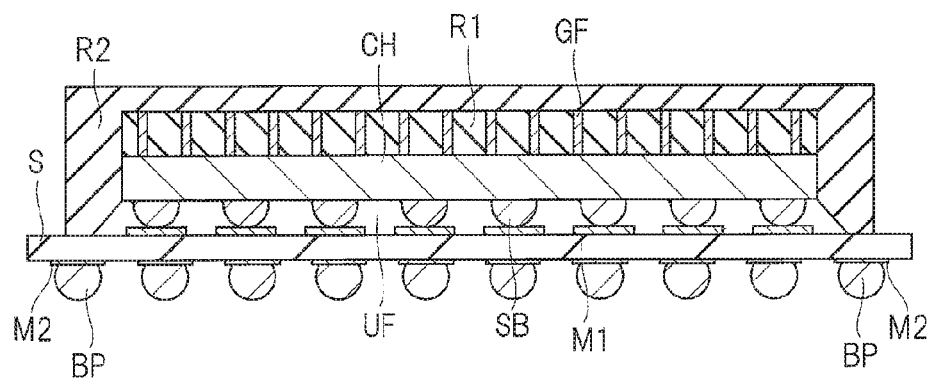
FIG. 24 is a cross-sectional view illustrating a manufacturing process of the semiconductor device according to the second embodiment.
Figure 25:
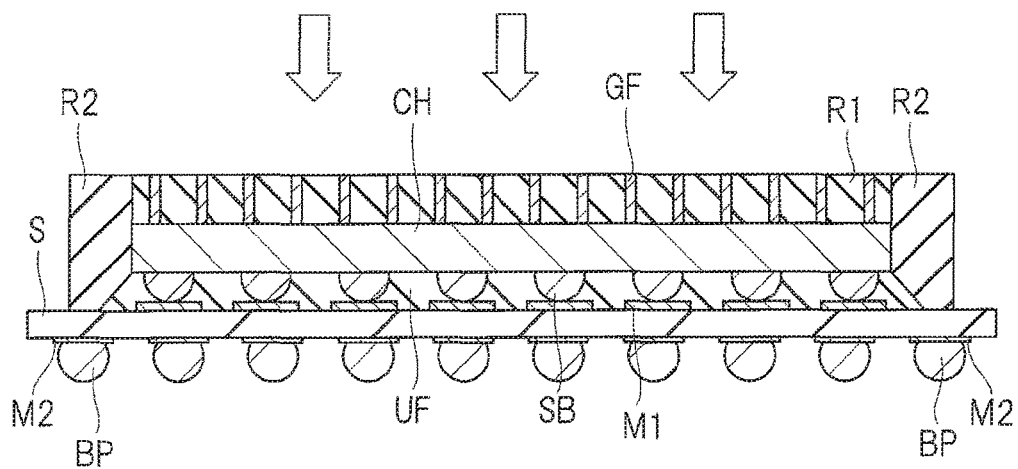
FIG. 25 is a cross-sectional view illustrating the manufacturing process of the semiconductor device according to the second embodiment, continued from FIG. 24.
Figure 26:
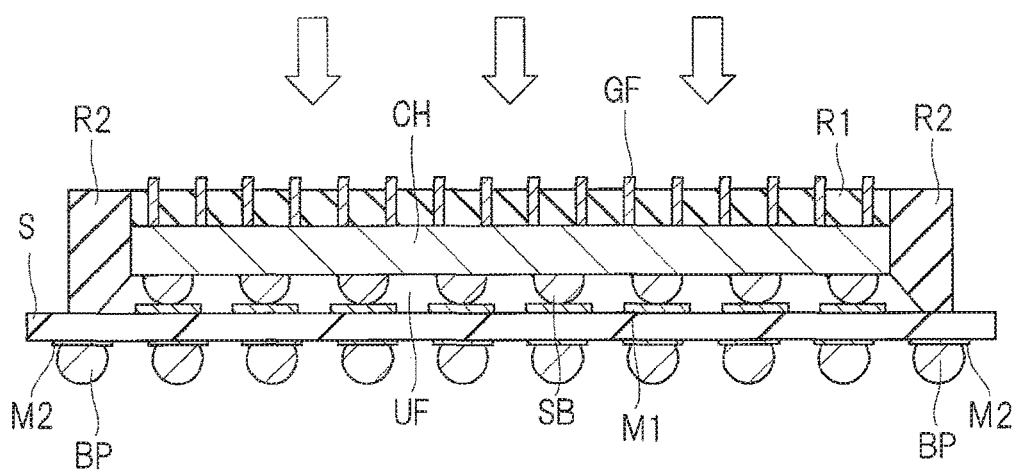
FIG. 26 is a cross-sectional view illustrating the manufacturing process of the semiconductor device according to the second embodiment, continued from FIG. 25.

Next, a manufacturing process of the semiconductor device according to this embodiment will be described, and a structure of the semiconductor device according to this embodiment will be further clarified. FIG. 24 is a cross-sectional view illustrating a manufacturing process of the semiconductor device according to the present embodiment. FIG. 25 is a cross-sectional view illustrating the manufacturing process of the semiconductor device according to the present embodiment, continued from FIG. 24. FIG. 26 is a cross-sectional view illustrating the manufacturing process of the semiconductor device according to the present embodiment, continued from FIG. 25.

As illustrated in FIG. 24, the graphite sheet (GF) and the resin tape R1 that are overlapped and rolled together (rolled body, see FIGS. 6A and 6B) are mounted on the semiconductor chip CH. Next, the substrate S and the like are sandwiched by an upper metal mold and a lower metal mold that are not illustrated. Next, a liquid resin (in this case, a thermosetting resin) is injected into a cavity, which is a space between the upper metal mold and the lower metal mold, and the cavity is filled therewith. After filling, the thermosetting resin is cured by performing heating treatment thereon. Accordingly, it is possible to form the sealing resin R2 that covers the semiconductor chip CH and the above-described rolled body (FIG. 24). Subsequently, the upper metal mold and the lower metal mold are separated.

Next, as illustrated in FIG. 25, the sealing resin R2 on the above-described rolled body is removed by polishing or etching back until the resin tape R1 is exposed. Next, as illustrated in FIG. 26, the exposed resin tape R1 is etched. Accordingly, the graphite sheet (GF) protrudes from the resin tape R1 by the same amount as the amount by which the resin tape R1 is etched. For example, it is possible to selectively etch (etch back) the resin tape R1 by use of a mixed gas of oxygen and $CF_4$.

Thus, it is possible to form the semiconductor device according to this embodiment (FIG. 23).

Third Embodiment

In this embodiment, various modification examples will be described.

First Modification Example

In the above-described embodiments, cases in which the heat dissipation unit (heat sink) is applied to the flip chip mounted semiconductor device have been described; however, it is also possible to apply the heat dissipation unit (heat sink) to a semiconductor device using a bonding wire.

Figure 27:
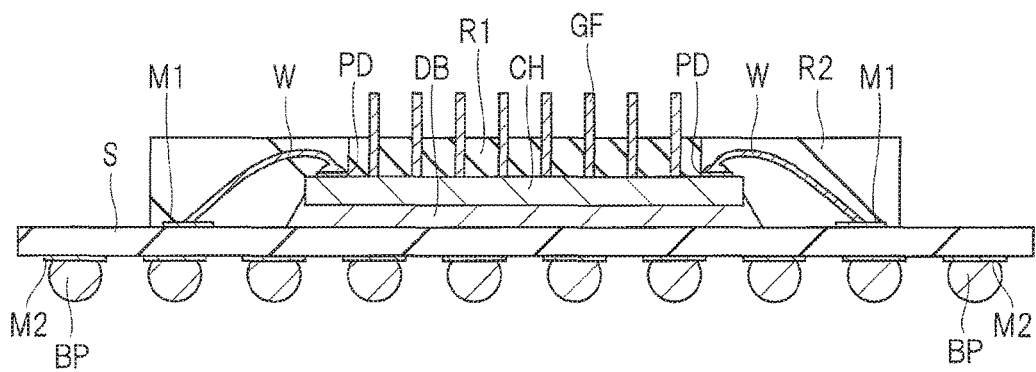
FIG. 27 is a cross-sectional view illustrating a configuration of a semiconductor device according to a first modification example of a third embodiment.

FIG. 27 is a cross-sectional view illustrating a configuration of a semiconductor device according to the first modification example of the present embodiment. The semiconductor device illustrated in FIG. 27 includes a semiconductor chip CH, and a sealing resin (resin body) R2 that covers the semiconductor chip. Here, the semiconductor chip CH is bonded to a substrate (also referred to as a mounting substrate or a wiring substrate) S via a die-bonding material (for example, resin paste) DB. A pad region PD is provided on an upper surface of the semiconductor chip CH. The pad region PD, for example, is a part of an uppermost wiring layer (exposed region) formed in the semiconductor chip. The pad region PD of the semiconductor chip CH is connected with a conductive portion (a part of a wire or a pad region) M1 provided on an upper surface of the substrate S via a bonding wire W. Furthermore, a bump electrode BP is formed on a lower surface of the substrate S through a conductive portion (a part of a wire or a pad region) M2.

Then, the heat dissipation unit (heat sink) is stuck to the upper surface of the semiconductor chip CH, and the upper surface and a side surface of the semiconductor chip CH are covered with the sealing resin R2.

For example, a height (thickness) of the resin tape R1 on the semiconductor chip CH and a height (thickness) of the sealing resin R2 are substantially the same. Then, an upper part of a graphite sheet (GF) protrudes from the resin tape R1.

Thus, also in this embodiment, since the heat dissipation unit (heat sink) constituted of graphene is provided on the semiconductor chip CH, it is possible to improve the heat dissipation characteristic of the semiconductor chip CH.

The semiconductor device according to this embodiment, for example, can be formed as follows. First, in the same manner as in the first embodiment, a lower surface of a wafer in which a semiconductor element such as a MISFET is formed is ground and is made thin (back grinding step). Next, the wafer is cut apart for each chip region (dicing step).

Next, the semiconductor chip CH is bonded to the substrate S (die-bonding step). For example, a plurality of semiconductor chips CH on a UV tape for dicing are irradiated with ultraviolet rays, whereby bonding strength of the UV tape is reduced. Next, while the upper surface of the semiconductor chip CH is adsorbed by a collet (adsorbing member) and the semiconductor chip CH is separated from the UV tape, the semiconductor chip CH is pressed against the substrate S on which an adhesive (resin paste) has been applied in advance. Next, the adhesive is cured by heating treatment or the like. Note that, on the upper surface and the lower surface of the substrate S, the conductive portions (a part of the wire or the pad regions) M1 and M2 such as a printed wire are formed. The conductive portions M1 and M2 are connected via a via hole provided so as to penetrate the substrate S, for example.

Next, the pad region PD of the semiconductor chip CH is connected with the conductive portion M1 of the substrate S by the bonding wire W (wire bonding step). As the bonding wire W, metal such as gold, copper, and aluminum may be used. For example, a molten ball is formed at one end of the metal wire, and the molten ball is squashed against and bonded to the pad region PD (ball bonding). The other end of the wire is thermally welded to the conductive portion M1 of the substrate S (wedge bonding). In addition, it is also possible to perform wire bonding by a thermocompression bonding method using ultrasonic wave in combination.

Next, each periphery of the semiconductor chip CH and the bonding wire W is covered with the sealing resin (mold resin) R2 (molding step). For example, a rolled sheet (rolled body) obtained by overlapping the graphite sheet (GF) and the resin tape R1 and rolling them together is mounted on the semiconductor chip CH. Next, the substrate S and the like are sandwiched by an upper metal mold and a lower metal mold that are not illustrated. Next, a liquid resin (in this case, a thermosetting resin) is injected into a cavity which is a space between the upper metal mold and the lower metal mold, and the cavity is filled therewith. After filling, the thermosetting resin is cured by performing heating treatment thereon. Accordingly, it is possible to form the sealing resin R2 that covers the semiconductor chip CH and the above-described rolled body. Subsequently, the upper metal mold and the lower metal mold are separated. Next, the sealing resin R2 on the above-described rolled body is polished until the resin tape R1 is exposed, and furthermore, the exposed resin tape R1 is etched (see the second embodiment). Accordingly, the graphite sheet (GF) protrudes from the resin tape R1 by the same amount as the amount by which the resin tape R1 is etched.

Thus, it is possible to form the semiconductor device according to this modification example (FIG. 27).

Second Modification Example

Figure 28:
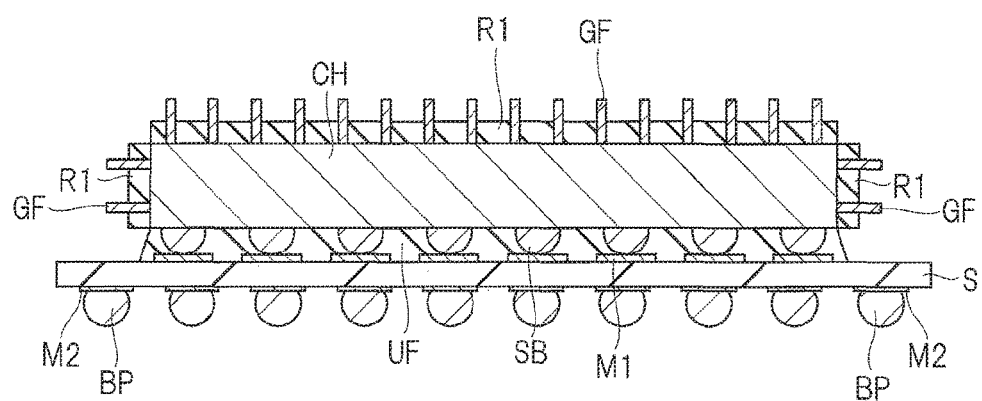
FIG. 28 is a cross-sectional view illustrating a configuration of a semiconductor device according to a second modification example of the third embodiment.

FIG. 28 is a cross-sectional view illustrating a configuration of a semiconductor device according to a second modification example of the present embodiment. In the above-described first embodiment, the heat dissipation unit (heat sink) is mounted on the upper surface of the semiconductor chip CH; however, it is also possible to dispose the heat dissipation unit (heat sink) so as to contact each side surface of the semiconductor chip CH as illustrated in FIG. 28. In this case, a graphene heat dissipation unit (heat sink) in the heat dissipation unit (heat sink) is disposed in a vertical direction to the side surface of the semiconductor chip CH.

Thus, since the heat dissipation unit (heat sink) is also provided on each of the side surface of the semiconductor chip CH in this embodiment, it is possible to further improve the heat dissipation characteristic of the semiconductor chip CH.

The semiconductor device according to this embodiment, for example, may be formed as follows. For example, the rolled body (the rolled sheet obtained by overlapping the graphite sheet (GF) and the resin tape R1 and rolling them together) illustrated in FIG. 5 is bonded to each of the upper surface and the side surfaces of the semiconductor chip CH by thermocompression bonding.

For example, it is also possible to stick the rolled body (the rolled sheet obtained by overlapping the graphite sheet (GF) and the resin tape R1 that have substantially the same width and rolling them together) illustrated in FIGS. 6A and 6B to each of the upper surface and the side surfaces of the semiconductor chip CH, to sandwich the substrate S and the like by the upper metal mold and the lower metal mold that are not illustrated, and to seal them with a resin. For example, a liquid resin (in this case, thermosetting resin) is injected into a cavity which is a space between the upper metal mold and the lower metal mold, and the cavity is filled therewith. After filling, the thermosetting resin is cured by performing heating treatment thereon. Accordingly, it is possible to form a sealing resin that covers the semiconductor chip CH and the above-described rolled body. Next, the upper metal mold and the lower metal mold are separated, and the sealing resin on the above-described rolled body is polished until the resin tape R1 is exposed. Furthermore, the exposed resin tape R1 is etched (see the second embodiment). Accordingly, the graphite sheet (GF) protrudes from the resin tape R1 by the same amount as the amount by which the resin tape R1 is etched.

Third Modification Example

Figure 29:
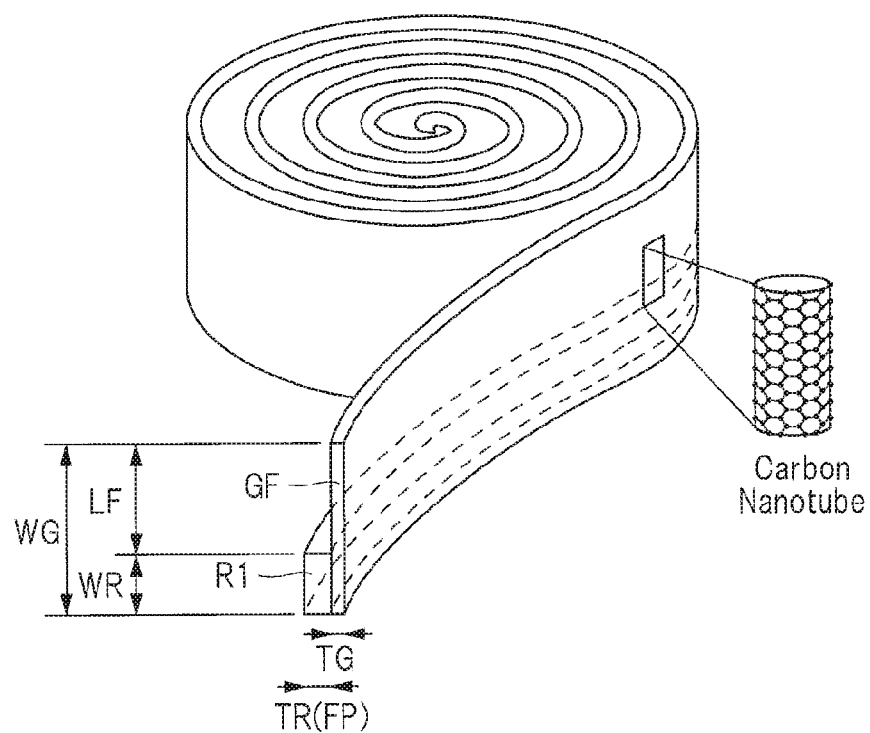
FIG. 29 is a partially exploded perspective view illustrating a configuration of a heat dissipation unit (heat sink) of a semiconductor device according to a third modification example of the third embodiment.

The graphite sheet is used in the above-described embodiments; however, it is also possible to use a super-growth tape. FIG. 29 is a partially exploded perspective view illustrating a configuration of a heat dissipation unit (heat sink) of a semiconductor device according to the third modification example of the third embodiment.

The super-growth tape is a tape constituted of a plurality of carbon nanotubes formed by using the super-growth CVD method. As illustrated in FIG. 29, for example, the carbon nanotubes are aligned and disposed in a direction crossing a longitudinal direction of the tape. The super-growth tape (GF) may be used in place of the graphite sheet of the above-described embodiments and modification examples. The heat dissipation characteristic may be improved also in a case where the super-growth tape is used since the carbon nanotubes are disposed in a direction crossing a surface of the semiconductor chip CH.

In the foregoing, the invention made by the inventor of the present invention has been concretely described based on the embodiments. However, it is needless to say that the present invention is not limited to the foregoing embodiments and various modifications and alterations can be made within the scope of the present invention.

APPENDIX 1

A semiconductor device includes:
a semiconductor chip; and
a heat dissipation unit on the semiconductor chip,
in which the heat dissipation unit has a resin and a fin protruding from the resin,
the fin has a carbon nanotube, and
the fin is disposed on the semiconductor chip such that the carbon nanotube is disposed in a direction crossing a surface of the semiconductor chip.

APPENDIX 2

The semiconductor device according to Appendix 1,
in which the heat dissipation unit is a rolled body in which a super-growth tape and a resin tape are layered and rolled.

APPENDIX 3

A semiconductor device includes:
a semiconductor chip;
a sealing resin on the semiconductor chip; and
a heat dissipation unit embedded in the sealing resin,
in which the heat dissipation unit has a resin and a fin protruding from the resin,
the fin has a carbon nanotube, and
the fin is disposed on the semiconductor chip such that the carbon nanotube is disposed in a direction crossing a surface of the semiconductor chip.

APPENDIX 4

The semiconductor device according to Appendix 3,
in which the heat dissipation unit is a rolled body in which a super-growth tape and a resin tape are layered and rolled.

APPENDIX 5

A method of manufacturing a semiconductor device, the method includes the steps of:
(a) preparing a heat dissipation unit; and
(b) mounting the heat dissipation unit on a semiconductor chip, in which the heat dissipation unit has a resin and a fin protruding from the resin,
the fin has a carbon nanotube, and
in the step (b), the heat dissipation unit is mounted on the semiconductor chip such that the carbon nanotube is disposed in a direction crossing a surface of the semiconductor chip.

APPENDIX 6

The method of manufacturing a semiconductor device according to Appendix 5,
in which a step of forming the heat dissipation unit includes the step of:
(a1) rolling a super-growth tape having a first width and a resin tape having a second width smaller than the first width in a layered state.

APPENDIX 7

The method of manufacturing a semiconductor device according to Appendix 5,
in which a step of forming the heat dissipation unit includes the steps of:
(a1) forming a rolled body by rolling a super-growth tape and a resin tape in a layered state; and
(a2) forming a fin constituted of the super-growth tape protruding from the resin tape by etching the resin tape exposed from one side of the rolled body.

APPENDIX 8

A method of manufacturing a semiconductor device, the method includes the steps of:
(a) preparing a rolled body in which a super-growth tape and a resin tape are layered and rolled;
(b) mounting the rolled body on a semiconductor chip;
(c) covering each periphery of the rolled body and the semiconductor chip with a sealing resin;
(d) removing the sealing resin on the rolled body until a surface of the rolled body is exposed; and
(e) forming a fin constituted of the super-growth tape and protruding from the resin tape by etching the resin tape exposed from the surface of the rolled body,
in which, in the step (b), the rolled body is mounted on the semiconductor chip such that a carbon nanotube constituting the super-growth tape is disposed in a direction crossing a surface of the semiconductor chip.

What is claimed is:
1. A semiconductor device comprising:
a semiconductor chip; and
a heat dissipation unit on the semiconductor chip,
wherein the heat dissipation unit has a resin and a fin protruding from the resin,
the fin comprises graphene, and
the fin contacts a surface of the semiconductor chip such that the graphene is disposed in a direction crossing the surface of the semiconductor chip.
2. The semiconductor device according to claim 1,
wherein the heat dissipation unit comprises a rolled body in which a graphite sheet and a resin tape are layered and rolled.
3. The semiconductor device according to claim 1, wherein the fin comprises a graphite sheet including a plurality of layered graphene sheets.
4. The semiconductor device according to claim 3, wherein a graphene sheet of the plurality of layered graphene sheets comprises sp2-bonded carbon atoms having a thickness of a single atom.
5. The semiconductor device according to claim 3, wherein the plurality of layered graphene sheets are layered in a thickness direction of the graphite sheet, and the thickness direction of the graphite sheet is formed parallel to the surface of the semiconductor chip.
6. The semiconductor device according to claim 5, wherein the graphite sheet projects from the surface of the semiconductor chip in a width direction of the graphite sheet which is perpendicular to the thickness direction of the graphite sheet.
7. The semiconductor device according to claim 1, wherein the fin comprises a graphite sheet and the resin comprises a resin tape, and the fin projects from the resin tape.
8. The semiconductor device according to claim 7, wherein the resin tape is thermocompression bonded to the surface of the semiconductor chip.
9. The semiconductor device according to claim 7, wherein the resin tape fixes the graphite sheet to the surface of the semiconductor chip.
10. The semiconductor device according to claim 7, wherein a thickness of the resin tape comprises a pitch between portions of the graphite sheet.
11. The semiconductor device according to claim 1, wherein a plurality of bumps are formed on a lower surface of the semiconductor chip, and the heat dissipation unit is formed on the surface of the semiconductor chip which is opposite the lower surface, such that the fin contacts the surface and projects perpendicularly from the surface.
12. The semiconductor device according to claim 1, wherein the fin and the resin are layered in a first direction, and the fin and the resin contact the surface of the semiconductor chip in a second direction opposite the first direction.
13. A semiconductor device comprising:
a semiconductor chip;
a sealing resin on the semiconductor chip; and
a heat dissipation unit embedded in the sealing resin,
wherein the heat dissipation unit has a resin and a fin protruding from the resin,
the fin comprises graphene, and
the fin contacts a surface of the semiconductor chip such that the graphene is disposed in a direction crossing the surface of the semiconductor chip.
14. The semiconductor device according to claim 13, wherein the heat dissipation unit comprises is a rolled body in which the graphite sheet and the resin tape are layered and rolled.
15. A method of manufacturing a semiconductor device, the method comprising:
preparing a heat dissipation unit; and
mounting the heat dissipation unit on a semiconductor chip,
wherein the heat dissipation unit has a resin and a fin protruding from the resin,
the fin comprises graphene, and
in the mounting of the heat dissipation unit, the heat dissipation unit is mounted on the semiconductor chip such that the fin contacts a surface of the semiconductor chip and the graphene is disposed in a direction crossing the surface of the semiconductor chip.
16. The method of manufacturing a semiconductor device according to claim 15, further comprising:
forming the heat dissipation unit comprising:

rolling a graphite sheet having a first width and a resin tape having a second width smaller than the first width in a layered state.

17. The method of manufacturing a semiconductor device according to claim 15, further comprising:
   forming the heat dissipation unit comprising:
      forming a rolled body by rolling a graphite sheet and a resin tape in a layered state; and
      forming the fin constituted of the graphite sheet and protruding from the resin tape by etching the resin tape exposed from one side of the rolled body.

18. A method of manufacturing a semiconductor device, the method comprising:
   preparing a rolled body in which a graphite sheet and a resin tape are layered and rolled;
   mounting the rolled body on a semiconductor chip;
   covering each periphery of the rolled body and the semiconductor chip with a sealing resin;
   removing the sealing resin on the rolled body until a surface of the rolled body is exposed; and
   forming a fin constituted of the graphite sheet and protruding from the resin tape by etching the resin tape exposed from the surface of the rolled body,
   wherein, in the mounting of the rolled body, the rolled body is mounted on the semiconductor chip such that graphene constituting the graphite sheet is disposed in a direction crossing a surface of the semiconductor chip.

* * * * *